United States Patent [19] | [11] Patent Number: 5,021,354
Pfiester | [45] Date of Patent: Jun. 4, 1991

[54] PROCESS FOR MANUFACTURING A SEMICONDUCTOR DEVICE

[75] Inventor: James R. Pfiester, Austin, Tex.

[73] Assignee: Motorola, Inc., Schaumburg, Ill.

[21] Appl. No.: 445,241

[22] Filed: Dec. 4, 1989

[51] Int. Cl.⁵ ........ H01L 21/266

[52] U.S. Cl. ........ 437/34; 437/56; 437/57; 437/933; 437/940

[58] Field of Search ........ 437/34, 56, 57, 933, 437/940; 148/DIG. 82

[56] References Cited

U.S. PATENT DOCUMENTS

| | | | |
|---|---|---|---|
| 4,027,380 | 6/1977 | Deal | 437/933 |
| 4,764,477 | 8/1988 | Chang | 437/34 |
| 4,771,014 | 9/1988 | Liou | 437/34 |

FOREIGN PATENT DOCUMENTS

| | | | |
|---|---|---|---|
| 0124270 | 9/1981 | Japan | 437/34 |
| 2153146 | 8/1985 | United Kingdom | 437/57 |

*Primary Examiner*—Olik Chaudhuri
*Assistant Examiner*—Ourmazd S. Ojan
*Attorney, Agent, or Firm*—John A. Fisher

[57] ABSTRACT

A process for the fabrication of CMOS devices is disclosed in which a selectively doped silicon layer is selectively oxidized to provide a differential thickness in the silicon and in the overlaying silicon oxide. In accordance with one embodiment, a semiconductor substrate is provided having a layer of silicon overlaying a surface of that substrate. A first area of the layer of silicon is selectively doped with N-type impurities while a second area is left undoped. The silicon is thermally oxidized to form a thermal oxide having a greater thickness over the N-type doped area than over the undoped area. Correspondingly, the silicon under the thick thermal oxide has a lesser thickness than the silicon under the thin thermal oxide. The layer of silicon is patterned to form gate electrodes and interconnects, with some of the gate electrodes formed from the silicon having N-type dopant and some of the gate electrodes formed from the silicon which is not doped N-type. Sidewall spacers are formed at the edges of the gate electrodes by anisotropically etching a sidewall spacer forming material. Because of the differential thickness of the gate electrode structures, the spacers at the edges of the N-type doped gate electrodes will be of a different thickness than are the sidewall spacers at the edges of the silicon gates not having the N-type doping. The sidewall spacers of different width are, in turn, used as a dopant mask for the formation of doped regions within the surface of the semiconductor substrate. The disclosed process allows independent doping of the polycrystalline silicon and the semiconductor substrate. A high doping concentration in the polycrystalline silicon helps to minimize the diffusing of dopant through a metal silicide layer formed on the polycrystalline silicon.

14 Claims, 3 Drawing Sheets

PROCESS FOR MANUFACTURING A SEMICONDUCTOR DEVICE

BACKGROUND OF THE INVENTION

This invention relates generally to the manufacture of semiconductor devices, and more specifically to an improved process for manufacturing silicon gate CMOS devices in which the silicon gate electrodes are doped independently of the source and drain doping.

The fabrication of CMOS semiconductor devices is a complicated process in which a large number of individual process steps must fit together in order to produce a reliable and manufacturable product. Each process step potentially increases the cost and complexity of the process and can lead to a decrease in the throughput or yield of the process. There has been, therefore, an effort to reduce the number of processing steps, especially photolithography steps, by combining functions, making certain process steps self aligning with respect to other process steps, and the like. The disadvantage of such reductions in the number of process steps, however, may be a loss in flexibility of the total process.

Always keeping in mind the concern for minimizing the number of process steps, however, additional steps are sometimes added to the process in order to improve the operating characteristics of the device being fabricated. For example, polycrystalline silicon electrodes and interconnection have been reduced in resistivity in order to improve the operating speed of the device. This is accomplished, in one process, by heavily doping the polycrystalline silicon with conductivity determining impurities. In the conventional process, however, the same doping operation is used to dope both the polycrystalline silicon and the source and drain regions in the underlying monocrystalline silicon substrate. Heavy doping in the polycrystalline silicon is inconsistent with the doping level and junction depth desired for the regions formed in the substrate. Relatively light doping in the polycrystalline silicon, which may be consistent with the desired doping level and junction depth in the source and drain regions, may cause unacceptable resistance in the polycrystalline silicon interconnection and from upper surface to lower surface of the polycrystalline silicon gate electrode. In accordance with an alternate process, the polycrystalline silicon regions in the semiconductor device are silicided with a metal silicide in order to reduce the resistivity. Although this may improve the conductivity along a polycrystalline silicon line, it does not necessarily improve the vertical conductivity in the polycrystalline silicon. The transconductance of the device is adversely affected by a high resistance in the vertical direction through the polycrystalline silicon as this introduces an unwanted or unacceptably high RC time constant. Additionally, it is known that conductivity determining impurities, especially N-type impurities, diffuse readily through silicided polycrystalline silicon. Thus N-type dopants in one portion of the circuit structure can rapidly diffuse through silicided polycrystalline silicon interconnecting lines to adversely dope the polycrystalline silicon gate electrode of an adjacent device. The doping in the polycrystalline silicon determines the gate-to-substrate work function and thus the threshold voltage of the device in question. The presence of N-type dopant, for example, in the gate electrode of a P-channel transistor causes an unwanted increase in the threshold voltage of that device.

In order to improve certain device characteristics, especially the resistance of the device to hot carrier injection (HCI) and the attendant reliability problems associated with HCI, many devices are fabricated using a lightly doped drain (LDD) structure. The process used to produce the LDD structure requires the formation of sidewall spacers on the side of the gate electrodes to space a heavily doped drain portion a predetermined distance away from the gate electrode. In the conventional process the width of the sidewall spacer is the same on all devices unless extra processing steps are used to produce different spacers on different devices. Accordingly, unless additional processing steps are used, the drain structure spacing on all devices using the spacers is the same.

Accordingly, a need existed for an improved process which would allow the independent doping of gate electrodes and source and drain regions in the substrate, which would improve the conductivity of the polycrystalline silicon, which would allow the silicidation of the polycrystalline silicon, and which would provide the flexibility of allowing different sidewall spacer widths on P-channel and N-channel transistors.

It is therefore an object of this invention to provide an improved process for fabricating CMOS devices having low polycrystalline silicon sheet resistivities.

It is the further object of this invention to provide an improved process for forming silicon gate CMOS devices in which the gate electrodes are doped independently of the source and drain regions.

It is yet another object of this invention to provide an improved silicon gate CMOS process having different sidewall spacer widths for N-channel and P-channel MOS transistors.

It is yet another object of this invention to provide an improved process for fabricating silicided silicon gate CMOS devices.

BRIEF SUMMARY OF THE INVENTION

The foregoing and other objects and advantages of the invention are achieved through a process in which a selectively doped silicon layer is selectively oxidized to provide a differential thickness in the silicon and in the overlaying silicon oxide. In accordance with one embodiment of the invention, a semiconductor substrate is provided having a layer of silicon overlaying a surface of that substrate. A first area of the layer of silicon is selectively doped with N-type impurities while a second area is left undoped. The silicon is thermally oxidized to form a thermal oxide having a greater thickness over the N-type doped area than over the undoped area. Correspondingly, the silicon under the thick thermal oxide will have a lesser thickness than the silicon under the thin thermal oxide. The layer of silicon is patterned to form gate electrodes and interconnects, with some of the gate electrodes formed from the silicon having N-type dopant and some of the gate electrodes formed from the silicon which is not doped N-type. Sidewall spacers are formed at the edges of the gate electrodes by anisotropically etching a sidewall spacer forming material. Because of the differential thickness of the gate electrode structures, the spacers at the edges of the N-type doped gate electrodes will be of a different thickness than are the sidewall spacers at the edges of the silicon gates not having the N-type doping. The sidewall spacers of different width are, in turn, used as a dopant mask for the formation of doped regions within the surface of the semiconductor substrate.

BRIEF DESCRIPTION OF THE DRAWINGS

FIGS. 1–3, 8, and 9 illustrate, in broken cross-section, process steps in accordance with an alternate embodiment of the invention.

DETAILED DESCRIPTION OF PREFERRED EMBODIMENTS

FIGS. 1–7 illustrate, in broken cross-section, process steps for the fabrication of a MOSFET in accordance with one embodiment of the invention. MOS is herein used to denominate an insulated gate field effect transistor regardless of whether the gate insulator is an oxide or other insulator material. The device to be fabricated is a silicon gate CMOS device. In the process steps illustrated, only a portion of one N-channel transistor and a portion of one P-channel transistor are depicted, although in actuality a plurality of each type of device would be fabricated simultaneously to implement the desired circuit function.

Figure 1:
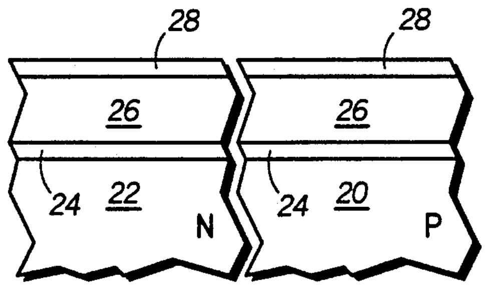
FIGS. 1–7 illustrate, in broken cross-section, process steps in accordance with one embodiment of the invention.

FIG. 1 illustrates the initial steps in the fabrication of a MOSFET device. The starting structure includes a silicon substrate having P-type surface region 20 and an N-type surface region 22. Surface regions 20 and 22 would be isolated at the surface by thick field oxide (not shown) or other means well known in the art. A gate insulator 24 such as a layer of thermally grown silicon dioxide is formed on the upper surface of the silicon substrate and a layer of undoped silicon 26 is deposited over gate insulator layer 24. Silicon layer 26 is deposited, for example, by chemical vapor deposition, evaporation, sputtering, or the like. Preferably, silicon layer 26 is polycrystalline silicon having a thickness of about 300 nanometers. The layer of polycrystalline silicon will ultimately form the gate electrodes of MOS transistors as well as a layer of conductive interconnection between devices. A thin layer of oxide 28 or other insulating material is formed on the exposed surface of polycrystalline silicon layer 26. Preferably oxide layer 28 is a thermally grown oxide having a thickness of about 20 nanometers. Oxide layer 28 provides a screen oxide for a subsequent implantation and also serves to protect polycrystalline silicon 26 from contamination.

Figure 2:
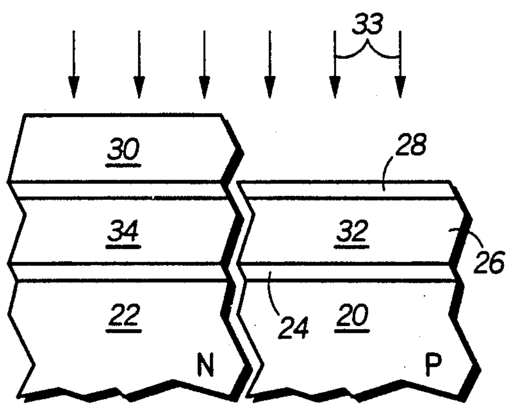

As illustrated in FIG. 2, a masking layer 30 such as a patterned layer of photoresist is provided overlaying N-type surface region 22. The location of the edges of masking element 30 are not critical and can be designed to overlay the field oxide or other means used to isolate surface area 20 from surface are 22. The photolithographic masking necessary to form masking element 30 is thus non-critical in alignment tolerance. Using masking element 30 as ion implantation mask, that portion 32 of polycrystalline silicon layer 26 which overlays surface area 20 is ion implanted with N-type conductivity determining ions as indicated by arrows 33. Preferably, portion 32 of the polycrystalline silicon layer is implanted with arsenic ions to a dose of about $2.5\text{–}5.0\times 10^{15}$ cm $^{-2}$. This implantation provides the desired doping for the gate electrodes of the N-channel transistors to be formed in surface region 20. Masking element 30 prevents the implantation of the N-type dopant ion into portion 34 of polycrystalline silicon layer 26.

Figure 3:
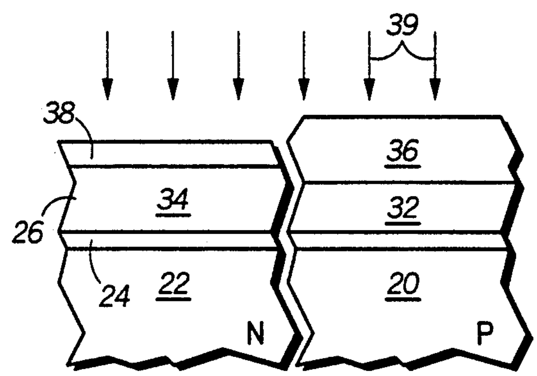

Masking element 30 is removed from the structure and the top surface of polycrystalline silicon layer 26 is thermally oxidized, for example, by heating for about one hour in a steam ambient at 830° C. Because portion 32 of polycrystalline silicon layer 26 is doped with a conductivity determining impurity and region 34 is undoped, the oxidation proceeds more rapidly over region 32 than over region 34. Consequently, a thick oxide layer 36 is grown over portion 32 and a thinner oxide 38 layer is grown over portion 34. For example, in the illustrative oxidation cycle, approximately 150 nanometers of silicon dioxide is grown over portion 32 and approximately 30 nanometers of silicon dioxide is grown over portion 34. The differential growth of a thick oxide over portion 32 and thin oxide over portion 34, of course, results in a greater thinning of portion 32 than of portion 34. Following the differential oxide growth, P-type dopant impurities are implanted into polycrystalline silicon layer 26 in a blanket implantation as illustrated by arrows 39. The energy of the implantation is adjusted so that the ions are implanted through thin oxide 38 but are masked by thicker oxide 36. Thus portion 34 of polycrystalline silicon layer 26 is implanted with P-type conductivity determining impurities. Preferably boron difluoride ions ($BF_2$) are implanted into portion 34 to a dose of $1.0\text{–}2.0\times 10^{16}\,\text{cm}^{-2}$. The implanted dose of P-type impurity is thus significantly higher than the dose of N-type impurity implanted into portion 32. As illustrated in FIG. 3, the structure now includes a thick oxide 36 overlaying N-type polycrystalline silicon portion 32 and a thin oxide layer 38 overlying P-type polycrystalline silicon portion 34. Polycrystalline silicon portion 34 has a greater thickness than does N-type portion 32. The stacked structure of polycrystalline silicon portion 32 and overlying oxide 36, however, is greater in thickness than is the stacked structure including polycrystalline silicon portion 34 and overlying oxide 38.

Figure 4:
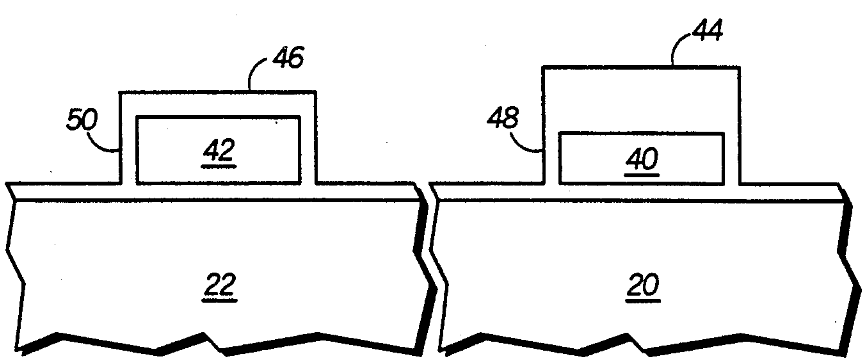
Figure 5:
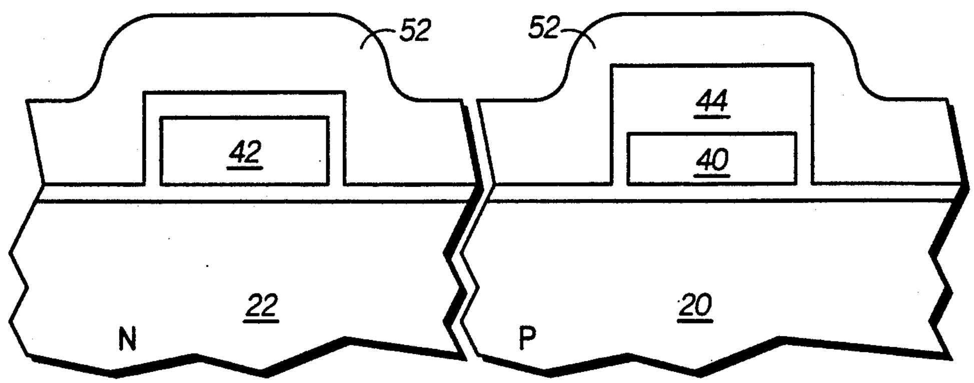
Figure 6:
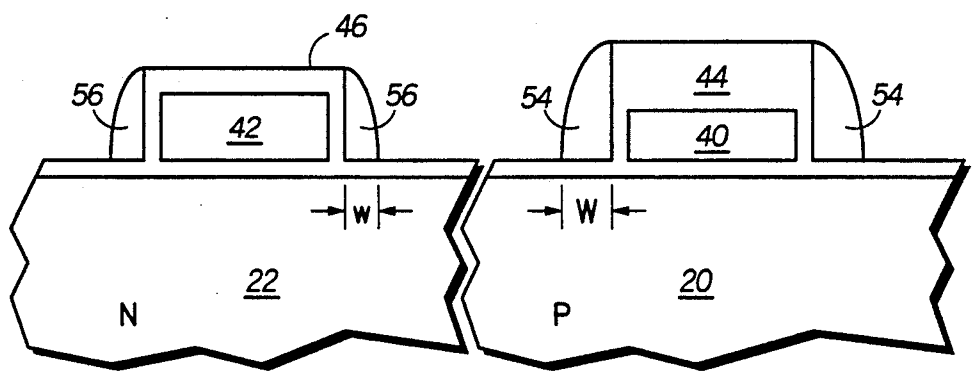

As illustrated in FIG. 4, in accordance with one embodiment of the invention, polycrystalline silicon portions 32 and 34 and their respective overlaying oxides, are patterned to form gate electrodes 40 and 42, respectively. Gate electrode 40 is overlaid by a thick oxide 44 which was formed from oxide layer 36. Gate electrode 42 is overlaid by a thin oxide 46 which was formed from thin oxide layer 38. The edges of gate electrodes 40 and 42 are thermally oxidized to form a sidewall oxide 48, 50, respectively. Again, the height of the stacked structure 40, 44, is greater than the height of the stacked structure 42, 46.

The process continues by the deposition of a sidewall spacer forming material 52 overlaying the entire structure. The sidewall spacer forming material is selected from those materials which are selectively etchable with respect to the silicon dioxide upon which the spacer forming material is deposited. Preferably, the spacer forming material is polycrystalline silicon or silicon nitride. The spacer forming material, such as polycrystalline silicon is deposited by chemical vapor deposition to a thickness of about 100–350 nanometers.

The spacer forming material 52 is anisotropically etched, such as by reactive ion etching, to form sidewall spacers at the edges of the gate electrode structures. Because of the nature of the anisotropic etch process, the width of the sidewall spacers which are formed is a function of the height of the structure at the edge of which the spacers are formed. Because the structure made up of gate electrode 40 and overlaying oxide 44 is higher than the structure made up of gate electrode 42 and overlaying oxide 46, sidewall spacers 54 at the edges of gate electrode 40 have a greater width, W, than the width, w, of the sidewall spacers 56 formed at the edges of gate electrode 42. The sidewall spacers formed over P-type surface region 20 are thus wider, in accordance with this embodiment of the invention, than are the sidewall spacers 56 formed over N-type surface region 22.

Figure 7:
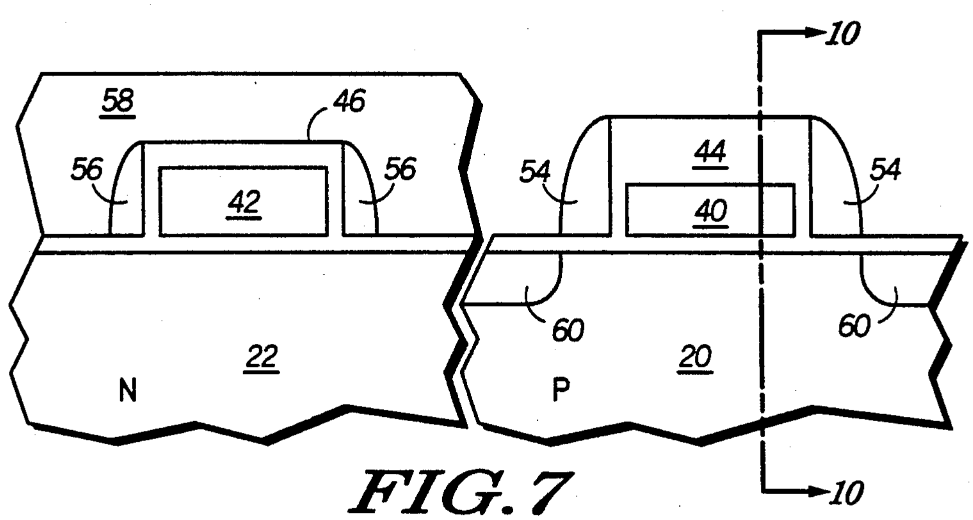

The process then continues, in conventional manner, as partially illustrated in FIG. 7, by forming source and drain regions for each of the transistors making up the integrated circuit. For example, as illustrated in FIG. 7, a photoresist mask 58 can be formed overlaying N-type surface region 22. Masking layer 58, together with sidewall spacers 54, gate electrode 40, and oxide 44, is used as an ion implantation mask to mask the implantation of heavily doped source and drain regions 60 of the N-channel transistor formed in P-type surface region 20. The process then continues in known manner, for example by removing sidewall spacers 54, implanting lightly doped drain regions (not shown) and subsequently forming P-type source and drain regions of the P-channel transistor formed in N-type surface region 22.

FIGS. 1-3, 8, and 9 illustrate a further embodiment of the invention. The initial steps in this embodiment of the invention are identical to those disclosed above, and hence the steps disclosed in FIGS. 1-3 are the same. With the structure in FIG. 3 as a starting point, in accordance with this embodiment of the invention, oxide layers 36 and 38 overlaying N-type doped polycrystalline silicon portion 32 and P-type doped polycrystalline silicon portion 34, respectively, are etched off to reveal the underlying polycrystalline silicon prior to the patterning of that polycrystalline silicon to form gate electrodes and interconnections.

Figure 8:
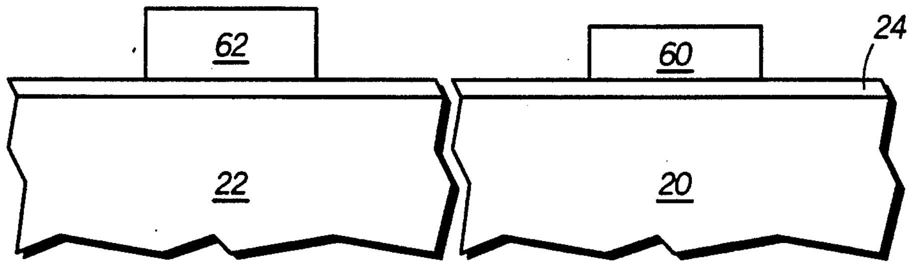

With the overlying oxide removed, polycrystalline silicon portions 32 and 34 are etched to form gate electrodes 60 and 62, respectively. In the patterning of gate electrode 60 and 62, the underlying insulator layer 24 is used as an etch stop so that the surfaces of P-type region 20 and N-type region 22 are not etched. Note that, as illustrated in FIG. 8, gate electrode 60 is of a lesser height than is gate electrode 62.

Figure 9:
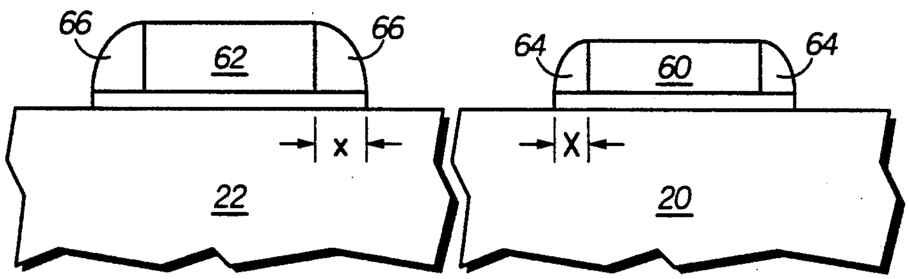

The process in accordance with this embodiment of the invention is continued by the deposition of a layer of sidewall spacer forming material overlaying the patterned gate electrodes. The sidewall spacer forming material can be, for example, a layer of low temperature deposited oxide, or the like, which is differentially etchable with respect to the polycrystalline silicon electrodes. The layer of sidewall spacer forming material is then anisotropically etched, such as by reactive ion etching, to form sidewall spacers 64 and 66 at the edges of gate electrode 60 and 62, respectively. Because of the difference in height of gate electrodes 60 and 62, the resulting sidewall spacers 64 and 66 are of a different width as illustrated in FIG. 9. In contrast to the first disclosed embodiment of the invention, in this embodiment sidewall spacers 66 have a width, x, which is greater than the width, X, of sidewall spacers 64. Thus it is possible, in accordance with the invention, to provide sidewall spacers of different width, with the option of having the greater width sidewall spacers accompanying either the gate electrodes of the N-channel transistors or the P-channel transistors.

Figure 10:
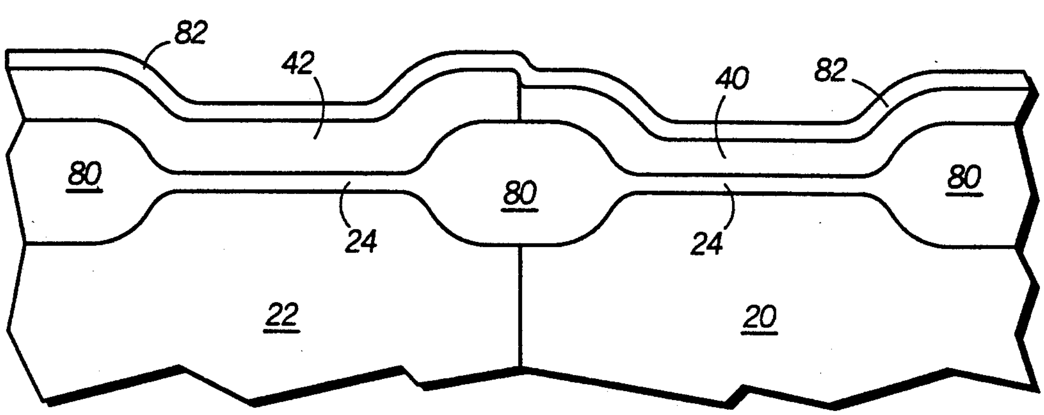
FIG. 10 illustrates, in cross-section, a portion of a semiconductor device fabricated in accordance with the invention including a silicided interconnecting line.

FIG. 10 illustrates, in a cross section which might be taken, for example, along a plane, as indicated, perpendicular to the plane of FIG. 7 a portion of a CMOS device after the surface of the polycrystalline silicon interconnection has been provided with a silicide layer 82. The device includes a P-type surface region 20 and an N-type surface region 22 electrically isolated at the surface by a thick field oxide 80. A gate insulator 24 is formed on each of the surface regions. Polycrystalline silicon layer 40 forms a gate electrode of an N-channel MOS transistor formed in surface region 20 and polycrystalline silicon layer 42 forms a gate electrode of a P-channel MOS transistor formed in surface region 22. Polycrystalline silicon layers 40 and 42 are processed in accordance with the invention and together form an electrical interconnection between the devices. In accordance with the invention, P-type polycrystalline silicon layer 42 is heavily doped with boron, independently of the doping of the source and drain regions of the P-channel transistor. The heavy boron doping in polycrystalline silicon layer 42 impedes the otherwise accelerated diffusion of N-type dopants from polycrystalline silicon layer 40, through silicide layer 82, into polycrystalline silicon layer 42. Thus devices fabricated in accordance with the invention are less susceptible to threshold voltage shift resulting from the accelerated diffusion.

Thus it is apparent that there has been provided, in accordance with the invention, a process for fabricating CMOS devices which fully meets the objects and advantages set forth above. Although the process has been described and illustrated with reference to specific embodiments thereof, it is not intended that the invention be limited to these illustrative embodiments. Those skilled in the art will recognize that variations and modifications are possible without departing from the spirit of the invention. For example, other materials can be used for forming the sidewall spacers and other conventional steps can be added to the process, before, after or interspersed with the steps enumerated. It is thus intended that the invention include all such variations and modifications as fall within the scope of the appended claims.

We claim:

1. A process for fabricating a CMOS device comprising the steps of:

providing a semiconductor substrate including a first N-type surface area and a second P-type surface area and having a gate insulator overlaying the first and second surface areas;

depositing a layer of polycrystalline silicon overlaying the gate insulator;

selectively doping portions of the layer of polycrystalline silicon overlaying the P-type surface area with N-type conductivity determining impurities;

thermally oxidizing the layer of polycrystalline silicon to form a thermal oxide having a first thickness over the portions not receiving the selective doping and a second thickness greater than the first thickness over those portions receiving the selective doping;

implanting the polycrystalline silicon with P-type conductivity determining impurities at an implant energy sufficient to penetrate the thermal oxide of first thickness but not sufficient to penetrate the thermal oxide of second thickness;

patterning the polycrystalline silicon and thermal oxide to form a first gate electrode overlaying the first surface area and a second gate electrode overlaying the second surface area and retaining the thermal oxide overlaying the gate electrodes;

depositing a layer of sidewall spacer forming material overlaying the gate electrodes;

anisotropically etching the layer of sidewall spacer forming material to form sidewall spacers at the edges of the gate electrodes, the sidewall spacers over the first surface area having a first width and the sidewall spacers over the second surface area having a second width greater than the first width.

2. The process of claim 1 further comprising the step of forming a silicide on the gate electrodes.

3. The process of claim 1 wherein the step of patterning the polycrystalline silicon comprises patterning the polycrystalline silicon to form interconnecting lines interconnecting the first and second gate electrodes.

4. The process of claim 1 comprising the further steps of: introducing P-type conductivity determining impurities into portions of the first surface area to form P-type source and drain regions; and introducing N-type conductivity determining impurities into portions of the second surface area to form N-type source and drain regions.

5. A process for fabricating a CMOS device comprising the steps of:

providing a semiconductor substrate including a first N-type surface area and a second P-type surface area and having a gate insulator overlaying the first and second surface areas;

depositing a layer of silicon overlaying the gate insulator;

selectively doping portions of the layer of silicon overlaying the P-type surface area with N-type conductivity determining impurities;

thermally oxidizing the layer of silicon to form a thermal oxide having a first thickness over the portions not receiving the selective doping and a second thickness greater than the first thickness over those portions receiving the selective doping;

implanting the silicon with P-type conductivity determining ions at an implant energy sufficient to penetrate the thermal oxide of first thickness but not sufficient to penetrate the thermal oxide of second thickness;

patterning the silicon to form a first gate electrode overlaying the first surface area and a second gate electrode overlaying the second surface area;

depositing a layer of sidewall forming material overlaying the gate electrodes;

anisotropically etching the layer of sidewall spacer forming material to form sidewall spacers at the edges of the gate electrodes, the sidewall spacers over the first surface area having a different width than the sidewall spacers over the second surface area.

6. The process of claim 5 wherein the thermal oxide is removed from the first and second gate electrodes before the step of patterning the silicon.

7. The process of claim 6 further comprising the step of forming a silicide on the gate electrodes.

8. The process of claim 5 wherein the step of depositing a layer of sidewall spacer forming material is performed with the thermal oxide in place overlaying the gate electrodes.

9. The process of claim 8 further comprising the step of forming a silicide on the gate electrodes.

10. A method for forming semiconductor devices comprising the steps of:

providing a semiconductor substrate;

depositing a layer of silicon overlaying said substrate;

selectively doping a first area and not a second area of said layer of silicon with impurities of first conductivity determining type;

thermally oxidizing said layer of silicon to form a thermal oxide having a first thickness over said first area of said silicon layer and a second thickness less than said first thickness over said second area;

patterning said layer of silicon to form silicon shapes having edges, first of said shapes formed from said first area of said silicon layer and second of said shapes formed from said second area of said silicon layer;

depositing a layer of sidewall spacer forming material overlaying said silicon shapes; and anisotropically etching said sidewall spacer forming material to form sidewall spacers at said edges of said silicon shapes, said sidewall spacers having a different width at said edges of said first shapes than at said edges of said second shapes.

11. The method of claim 10 further comprising the step of forming a metal silicide overlaying said silicon shapes.

12. The method of claim 11 wherein said step of patterning comprises forming lines interconnecting selected ones of said shapes.

13. The method of claim 10 further comprising the additional step of doping portions of said substrate with conductivity determining ions.

14. The method of claim 10 further comprising the step of implanting said silicon layer with conductivity determining ions of second conductivity type at an energy sufficient to penetrate said thermal oxide of second thickness, but not sufficient to penetrate said thermal oxide of first thickness.

* * * * *